United States Patent
Tung et al.

(10) Patent No.: US 10,684,312 B2
(45) Date of Patent: Jun. 16, 2020

(54) CURRENT DETECTION DEVICE AND METHOD

(71) Applicant: INDUSTRIAL TECHNOLOGY RESEARCH INSTITUTE, Hsinchu (TW)

(72) Inventors: Mean-Jue Tung, Kinmen County (TW); Shi-Yuan Tong, Hsinchu County (TW); Yu-Ting Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 265 days.

(21) Appl. No.: 15/854,617

(22) Filed: Dec. 26, 2017

(65) Prior Publication Data

US 2019/0195917 A1    Jun. 27, 2019

(51) Int. Cl.
*G01R 15/14* (2006.01)
*G01R 19/00* (2006.01)
*G01R 15/20* (2006.01)

(52) U.S. Cl.
CPC ......... *G01R 15/148* (2013.01); *G01R 15/207* (2013.01); *G01R 19/0092* (2013.01)

(58) Field of Classification Search
CPC .................................................. G01R 15/148
USPC .......................................................... 702/64
See application file for complete search history.

(56) References Cited

U.S. PATENT DOCUMENTS

| 8,659,286 B2 | 2/2014 | Reynolds |
| 9,000,752 B2 | 4/2015 | El-Essawy et al. |
| 2005/0156587 A1* | 7/2005 | Yakymyshyn ....... G01R 15/207 324/117 R |

(Continued)

FOREIGN PATENT DOCUMENTS

| CN | 2684433 Y | 3/2005 |
| CN | 105319429 A | 2/2016 |

(Continued)

OTHER PUBLICATIONS

WO 2015/144541 A2—Machine Translation (Year: 2015).*

(Continued)

*Primary Examiner* — Ricky Ngon
(74) *Attorney, Agent, or Firm* — Maschoff Brennan

(57) ABSTRACT

A current detection device applied to a multi-core conducting wire comprises a carrier, magnetic sensors and a processor wherein the processor is connected to the magnetic sensors. The carrier has an accommodating channel for accommodating the multi-core conducting wire. The magnetic sensors are disposed at the carrier, surround the accommodating channel, equally share 360 degree of the peripheral of the accommodating channel, and are configured to measure an alternating magnetic field of the multi-core conducting wire to respectively obtain magnetic field measured values, wherein each of the magnetic sensors corresponds to a respective one of the magnetic field measured values. The processor stores a current decoupling model, and is configured to obtain the magnetic field measured values from the magnetic sensors and to calculate a current value of each core wire of the multi-core conducting wire according to the current decoupling model and the magnetic field measured values.

12 Claims, 8 Drawing Sheets

(56) References Cited

U.S. PATENT DOCUMENTS

| | | | |
|---|---|---|---|
| 2011/0050222 A1 | 3/2011 | Ueno et al. | |
| 2013/0076343 A1* | 3/2013 | Carpenter | G01R 33/02 324/202 |
| 2014/0097826 A1 | 4/2014 | Hebiguchi et al. | |
| 2014/0292309 A1* | 10/2014 | Kurashima | G01R 19/20 324/144 |
| 2016/0223699 A1* | 8/2016 | Peczalski | G01R 19/0053 |

FOREIGN PATENT DOCUMENTS

| | | |
|---|---|---|
| EP | 2725374 A2 * | 4/2014 |
| JP | H08-1869 B2 | 1/1996 |
| JP | 4004870 B2 | 11/2007 |
| JP | 2011053061 | 3/2011 |
| JP | 5830696 B2 | 12/2015 |
| TW | 536627 B | 6/2003 |
| TW | 1502205 B | 10/2015 |
| WO | 2013005459 A1 | 1/2013 |
| WO | WO-2013057246 A1 * | 4/2013 |
| WO | 2015/144541 A2 | 10/2015 |
| WO | WO-2015144541 A2 * | 10/2015 |

OTHER PUBLICATIONS

Jang, Y.-H., et al., "Three phase current reconstruction method using predictive current in three shunt sensing PWM inverter," IEEE Transportation Electrification Conference and Expo, Asia—Pacific (ITEC), pp. 436-440 (Jun. 1-4, 2016).

Khawaja, A.H., and Huang, Q., "Estimating Sag and Wind-Induced Motion of Overhead Power Lines With Current and Magnetic-Flux Density Measurements," IEEE Transactions on instrumentation and measurement, vol. 66, Issue 5, pp. 897-909 (May 2017).

Liang, C.-T., et al., "New Electronic Current Transformer With a Self-Contained Power Supply," IEEE Transactions on power delivery, vol. 30, Issue 1, pp. 184-192 (Feb. 2015).

TW Office Action in application No. 106145691 dated May 9, 2018.

* cited by examiner

CURRENT DETECTION DEVICE AND METHOD

TECHNICAL FIELD

This disclosure relates to a current detection device, and particularly to a current detection device applied to a multi-core conducting wire.

BACKGROUND

In the modern industrial industry, various kinds of facilities rely on the electricity to operate. When electricity imbalance or harmonic interference occurs, the electric power decreases so that the problem such as the increase of the temperature of circuits is caused. In severe cases, it may even result in the breakdown or shutdown of the facilities. The electricity imbalance is often derived from the inconsistency between the currents transmitted by the core wires in the conducting wire for transmitting the electricity. Therefore, current transformers or shunt resistors are often used to detect the current of the conducting wire nowadays.

However, these current detection devices are only applicable to the measurement of a single core wire. In other words, if these current detection devices are used to measure a conducting wire with a plurality of core wires, the conducting wire should be disassembled for exposing the included core wires, and then these core wires are respectively measured. As a result, it not only damages the conducting wire but also be not able to perform the detection in real time during the operation of the facilities.

SUMMARY

Accordingly, this disclosure provides a current detection device and method for obtaining the current value of each core wire in a multi-core conducting wire.

According to an embodiment of this disclosure, a current detection device is applied to a multi-core conducting wire. The current detection device comprises a carrier, a plurality of magnetic sensors and a processor, wherein the processor is electrically connected with the plurality of magnetic sensors. The carrier comprises an accommodating channel for accommodating the multi-core conducting wire. The plurality of magnetic sensors is disposed at the carrier, surrounds the accommodating channel, equally shares the 360-degree peripheral of the accommodating channel, and is configured to measure the alternating magnetic field of the multi-core conducting wire when the multi-core conducting wire is powered on, so as to generate a plurality of magnetic field measured values, with each of the plurality of magnetic field measured values corresponding to one of the plurality of magnetic sensors. The processor stores a current decoupling model, and is configured to capture the plurality of magnetic field measured values from the plurality of magnetic sensors, and to calculate the current value of each of core wires of the multi-core conducting wire according to the current decoupling model and the plurality of magnetic field measured values.

According to an embodiment of this disclosure, a current detection method is applied to a multi-core conducting wire. The current detection method comprises setting a plurality of magnetic sensors to surround the multi-core conducting wire and to equally share the 360-degree peripheral of the multi-core conducting wire, measuring the alternating magnetic field of the multi-core conducting wire by the plurality of magnetic sensors when the multi-core conducting wire is powered on so as to generate a plurality of magnetic field measured values, calculating the current value of each of core wires of the multi-core conducting wire according to a current decoupling model and the plurality of magnetic field measured values, wherein each of the plurality of magnetic field measured values corresponds to one of the plurality of magnetic sensors.

In view of the above description, the current detection device and method provided in this disclosure may analyze the current value and the phase of each core wire in the target conducting wire which comprises a plurality of core wires through the annular setting of the magnetic sensors and the calculation of the current decoupling model, without separating each core wire from one another in the target conducting wire, so that the damage to the target conducting wire may be avoided, the detection may be performed in real time during the operation of the facility, and it may be unnecessary to consider the relative positions or angle between the multi-core conducting wire and the carrier.

The above description of the summary of this invention and the description of the following embodiments are provided to illustrate and explain the spirit and principles of this invention, and to provide further explanation of the scope of this invention.

DETAILED DESCRIPTION

The detailed features and advantages of the invention will be described in detail in the following description, which is intended to enable any person having ordinary skill in the art to understand the technical aspects of the present invention and to practice it. In accordance with the teachings, claims and the drawings of the invention, any person having ordinary skill in the art is able to readily understand the objectives and advantages of the invention. The following embodiments illustrate the invention in further detail, but the scope of the invention is not limited by any point of view.

Figure 1:
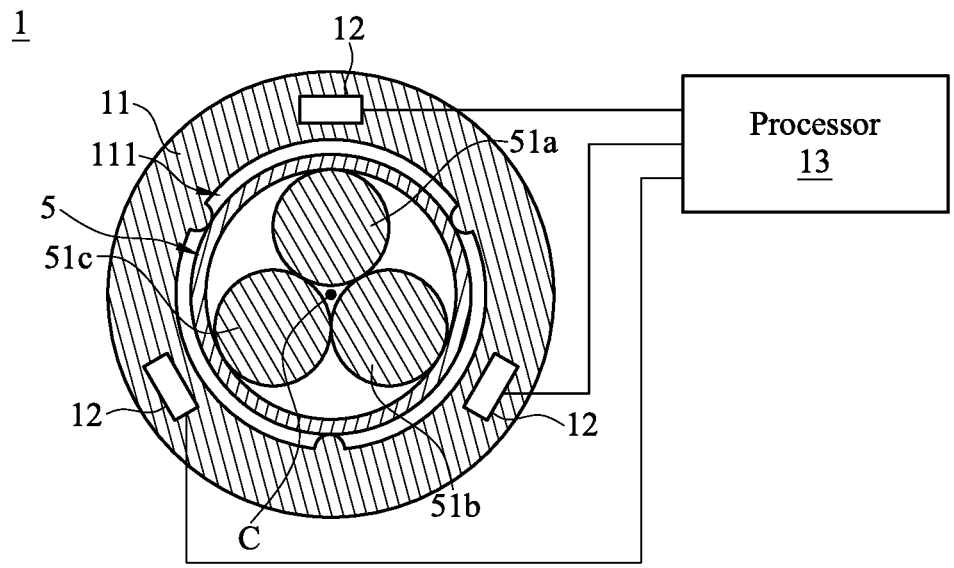
FIG. 1 is a schematic diagram of a current detection device according to an embodiment of this disclosure.

Please refer to FIG. 1, wherein FIG. 1 is a schematic diagram of a current detection device according to an embodiment of this disclosure. The current detection device 1 is applied to a multi-core conducting wire 5, and comprises a carrier 11, a plurality of magnetic sensors 12 and a processor 13 which is electrically connected with the plurality of magnetic sensors 12. In FIG. 1, as an illustrative example, a three-core conducting wire comprising three core wires 51a, 51b and 51c serves as the multi-core conducting wire 5, and three magnetic sensors 12 are disposed. As shown in FIG. 1, the carrier 11 of the current detection device 1 has an accommodating channel 111 for accommodating the multi-core conducting wire 5. More specifically, the carrier 11 has a ring structure, and the accommodating channel 111 is formed in the middle of the ring structure, wherein the accommodating channel 111 can be designed in the shape such as circle or square corresponding to the shape of the multi-core conducting wire 5, and the circle is exemplified in FIG. 1; however, this disclosure is not limited to this. In FIG. 1, the carrier 11 is connected with the multi-core conducting wire 5 in rotatably relationship, and has bumps protruding from the inner wall for fixing the axle center of the multi-core conducting wire 5 in the center of the accommodating channel 111. Moreover, a person having ordinary skill in the art is also able to design other structure of the carrier for being rotatably connected with the multi-core conducting wire and fixing the axle center of the multi-core conducting wire in the center of the accommodating channel.

The magnetic sensors 12 are disposed at the carrier 11 and surround the accommodating channel 111, and these three magnetic sensors 12 equally share the 360-degree peripheral of the accommodating channel 111. In other words, in this embodiment, the three magnetic sensors 12 of the current detection device 1 are disposed around the accommodating channel 111 at 120 degrees from one another, and the distance between each of the magnetic sensors 12 and the center C of the accommodating channel 111 is the same. The magnetic sensors 12 are configured to measure the alternating magnetic field of the multi-core conducting wire 5 when the multi-core conducting wire 5 is powered on so as to generate magnetic field measured values. As a result, the three magnetic sensors 12 measure three magnetic field measured values. The processor 13, such as a programmable system on chip, comprises a memory for storing a current decoupling model, and is configured to calculate the current value of each of the core wires 51a-51c of the multi-core conducting wire 5 according to the stored current decoupling model and the magnetic field measured values measured by the magnetic sensors 12, wherein the details of the current decoupling model are described later.

Further, the processor 13 calculates the current value of each of the core wires 51a-51c according to the stored current decoupling model and the magnetic field measured values measured by all the magnetic sensors 12 when the magnetic field measured value measured by one of the three magnetic sensors 12 matches a preset condition, wherein the preset condition can indicate that the magnetic field measured value reaches the maximum magnetic field measured value measured by the corresponding magnetic sensor during its rotation relative to the multi-core conducting wire 5. For example, a user can rotate the multi-core conducting wire 5 or the carrier 11 to make the two relatively rotate, obtain the magnetic field measured values measured by the magnetic sensors 12 from their display interfaces, so as to select one of the magnetic sensors 12, determine whether the magnetic field measured value corresponding to this magnetic sensors 12 matches the aforementioned preset condition, and stop rotating the multi-core conducting wire 5 or the carrier 11 when the magnetic field measured value corresponding to the selected magnetic sensor 12 matches the preset condition, and using the processor 13 to perform the calculation of the current value of each of the core wires 51a-51c.

Figure 2:
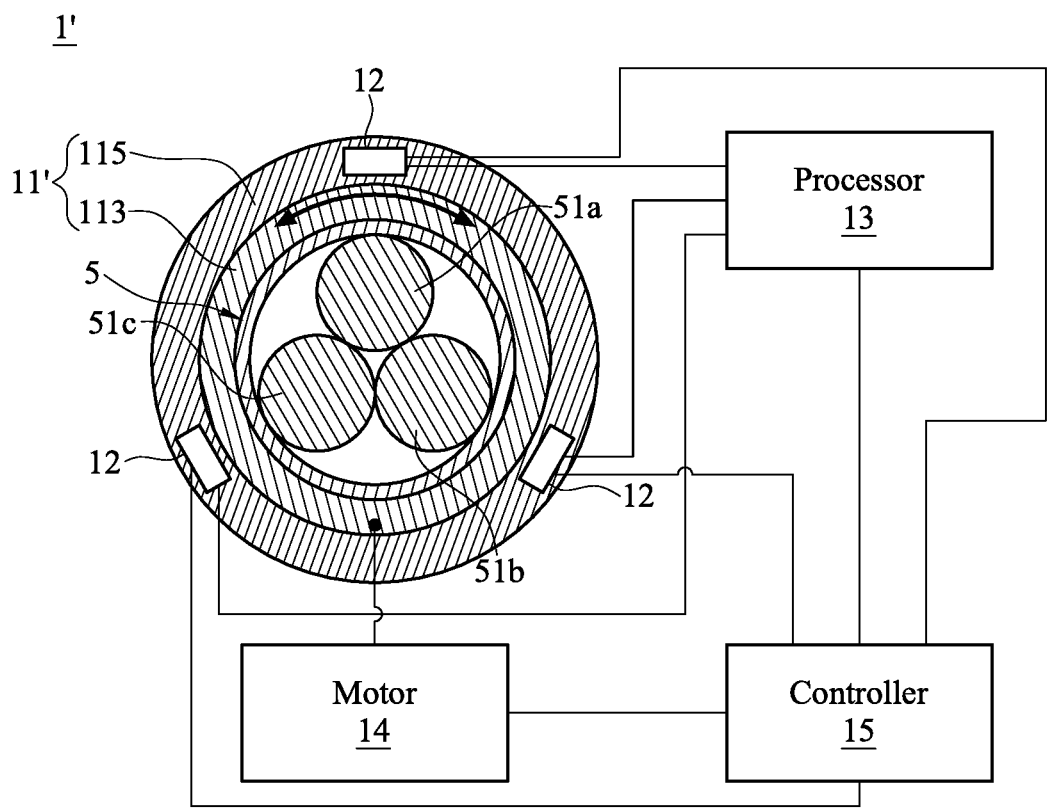
FIG. 2 is a schematic diagram of a current detection device according to another embodiment of this disclosure.

Please refer to FIG. 2, wherein FIG. 2 is a schematic diagram of a current detection device according to another embodiment of this disclosure. The current detection device 1' shown in FIG. 2, similar to the current detection device 1 shown in FIG. 1, comprises a carrier 11', a three magnetic sensors 12 and a processor 13 electrically connected with these magnetic sensors 12, wherein the carrier 11' further comprises a inner ring component 113 and an outer ring component 115. The inner ring component 113 is rotatably disposed within the outer ring component 115, and configured to fix the three-core conducting wire serving as the multi-core conducting wire 5. The three magnetic sensors 12 are disposed at the outer ring component 115; in other words, there is rotatable relationship between the magnetic sensors 12 and the three-core conducting wire.

In this embodiment, the current detection device 1' can further comprise a motor 14 and a controller 15, wherein the motor 14 is connected with the carrier 11', and particularly connected with the inner ring component 113 or the outer ring component 115 of the carrier 11'. The controller 15 is connected with the motor 14, each magnetic sensor 12 and the processor 13. More specifically, as shown in FIG. 2, the motor 14 can be connected with the inner ring component 113 of the carrier 11'. The motor 14 brings the inner ring component 113 to rotate relatively to the outer ring component 115 when being controlled by the controller 15 to rotate, so that the three-core conducting wire 5 which is fixed by the inner ring component 113 rotates relatively to the magnetic sensor 12 which is located at the outer ring component 115. Moreover, the motor 14 can also be connected with the outer ring component 115 of the carrier 11' so as to bring the outer ring component 115 to rotate relatively to the inner ring component 113 when rotating.

The controller 15 captures the magnetic field measured value corresponding to one of the three magnetic sensors 12 when the inner ring component 113 rotates relatively to the outer ring component 115 (i.e. the three-core conducting wire 5 rotates relatively to the magnetic sensors 12), and determines whether this magnetic field measured value matches the preset condition. More specifically, while controlling the three-core conducting wire 5 to rotate relatively to the magnetic sensors 12, the controller 15 selects one magnetic sensor 12 of the three magnetic sensors 12 to capture the magnetic field measured value measured by it, and determines whether the captured magnetic field measured value matches the preset condition prestored inside the controller 15, wherein the preset condition indicates that the magnetic field measured value reaches the maximum magnetic field measured value measured by the corresponding magnetic sensor during its rotation relative to the multi-core conducting wire 5. When the controller 15 determines that the captured magnetic field measured value matches the preset condition, it controls the motor 14 to stop rotating, and instructs the processor 13 to capture the magnetic field measured value measured by each magnetic sensor 12 for executing the calculation of the current value of each of the core wires 51a-51c.

In the above embodiment, the inner ring component 113 and the outer ring component 115 of the carrier 11' are driven to rotate relatively to each other by the controller 15 and the motor 14; however, in another embodiment, the inner ring component 113 and the outer ring component 115 can also be driven to rotate relatively to each other by other mechanism or by an artificial way, which is not limited in this disclosure.

Figure 3A:
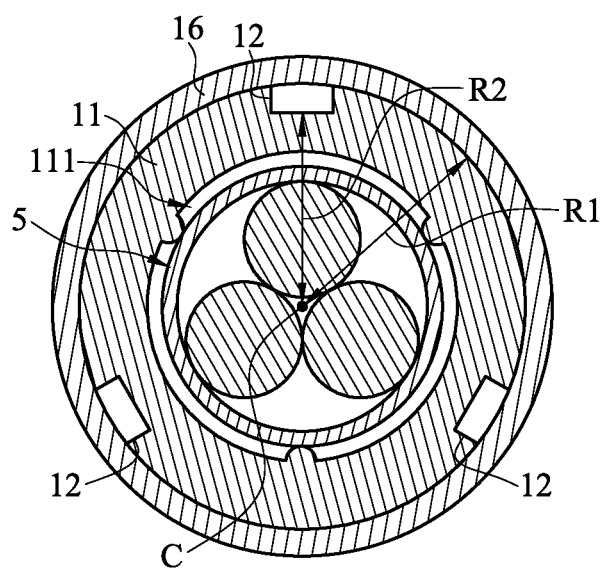
FIG. 3A is a schematic diagram of a carrier of a current detection device according to yet another embodiment of this disclosure.
Figure 3B:
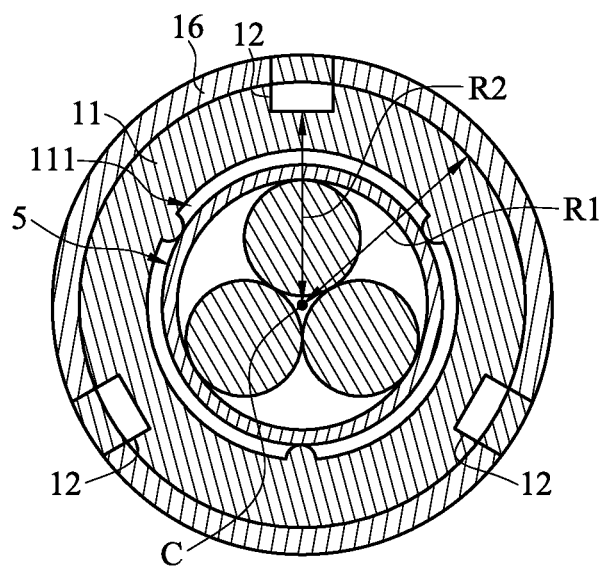
FIG. 3B is a schematic diagram of a carrier of a current detection device according to yet another embodiment of this disclosure.

For yet another embodiment, please refer to FIG. 1, FIG. 3A and FIG. 3B, wherein FIG. 3A is a schematic diagram of a carrier of a current detection device according to yet another embodiment of this disclosure; and FIG. 3B is a schematic diagram of a carrier of a current detection device according to yet another embodiment of this disclosure. FIG. 3A and FIG. 3B illustrates other embodiments of the carrier 11 of the current detection device 1 in the FIG. 1. In the embodiments of FIG. 3A and FIG. 3B, there is further a flux guiding assembly 16 disposed at the carrier 11, wherein the flux guiding assembly 16 is metal or oxide for example, and continuously (as shown in FIG. 3A) or intermittently (as shown in FIG. 3B) surrounds the accommodating channel 111. The distance between the flux guiding assembly 16 and the accommodating channel 111 is larger than or equal to the distance between the magnetic sensors 12 and the accommodating channel 111. For example, the side, near to the accommodating channel 111, of the flux guiding assembly 16 is disposed on the circle centered at the center C of the accommodating channel 111 and having a radius R1, and the side, near to the accommodating channel 111, of the magnetic sensor 12 is disposed on the circle centered at the center C of the accommodating channel 111 and having a radius R2, wherein the radius R1 is larger than the radius R2. The magnetic flux of the alternating magnetic field generated when the multi-core conducting wire 5 is powered on can be collected through the disposition of the flux guiding assembly 16. In particular, FIG. 3A and FIG. 3B exemplarily illustrate that the flux guiding assembly 16 is disposed on the outer edge of the carrier 11; however, in another embodiment, the flux guiding assembly 16 can also be spaced from the outer edge of the carrier 11, which is not limited in this disclosure.

Figure 4:
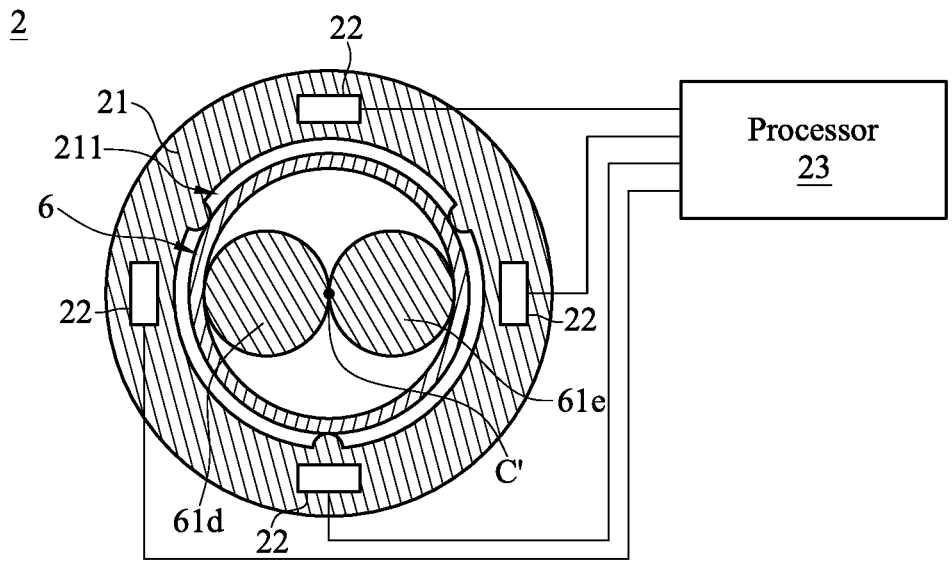
FIG. 4 is a schematic diagram of a current detection device according to yet another embodiment of this disclosure.

Please refer to FIG. 4, wherein FIG. 4 is a schematic diagram of a current detection device according to yet another embodiment of this disclosure. The current detection device 2 is applied to a multi-core conducting wire 6, and comprises a carrier 21, a plurality of magnetic sensors 22 and a processor 23 electrically connected with the plurality of magnetic sensors 22. In FIG. 4, the a dual-core conducting wire comprising two core wires 61d and 61e serves as the multi-core conducting wire 6, and four magnetic sensors 22 are disposed in the current detection device 2 for an exemplary explanation. In this embodiment, the structure of the carrier 21 of the current detection device 2 is similar to that of the carrier shown in FIG. 1, so it is not repeated herein.

The magnetic sensors 22 of the current detection device 2 are disposed at carrier 21, surround the accommodating channel 211, and equally share the 360-degree peripheral of the accommodating channel 211. In other words, In this embodiment, the four magnetic sensors 22 of the current detection device 2 are disposed around the accommodating channel 211 at 90 degrees from one another, and the distance between each of the magnetic sensors 22 and the center C' of the accommodating channel 211 is the same. The magnetic sensors 22 are configured to measure the alternating magnetic field of the multi-core conducting wire 6 when the multi-core conducting wire 6 is powered on so as to generate magnetic field measured values. As a result, the four magnetic sensors 22 measure four magnetic field measured values. The processor 23, such as a programmable system on chip, comprises a memory for storing a current decoupling model, and is configured to calculate the current value of each of the core wires 61d and 61e of the multi-core conducting wire 6 according to the stored current decoupling model and the magnetic field measured values measured by the magnetic sensors 22, wherein the details of the current decoupling model are described later.

In another embodiment, the current detection device 2 can further comprise the flux guiding assembly 16 as shown in FIG. 3A or FIG. 3B for collecting the magnetic flux of the alternating magnetic field generated when the multi-core conducting wire 6 is powered on. In this embodiment, the structure and the position of the flux guiding assembly are similar to those described in the embodiment of FIG. 3A or FIG. 3B, so they are not repeated herein.

Figure 5:
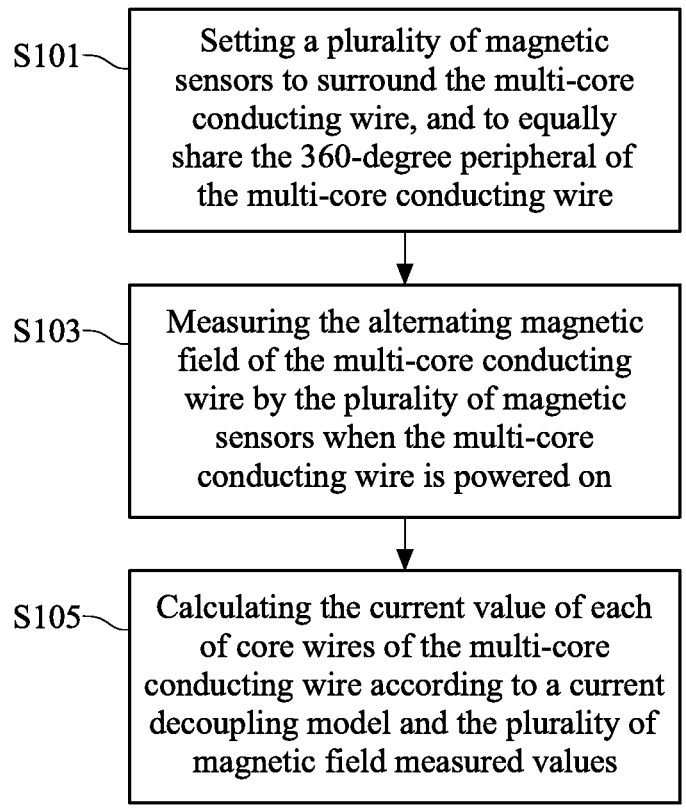
FIG. 5 is a flowchart of a current detection method according to an embodiment of this disclosure.
Figure 6:
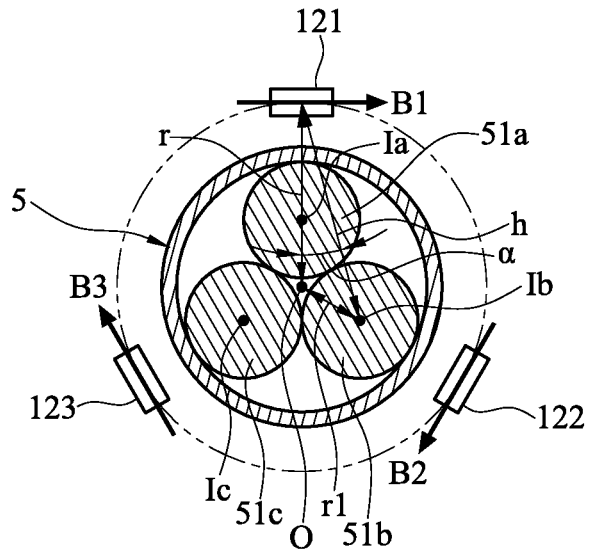
FIG. 6 is a schematic diagram of a current detection method according to an embodiment of this disclosure.
Figure 7:
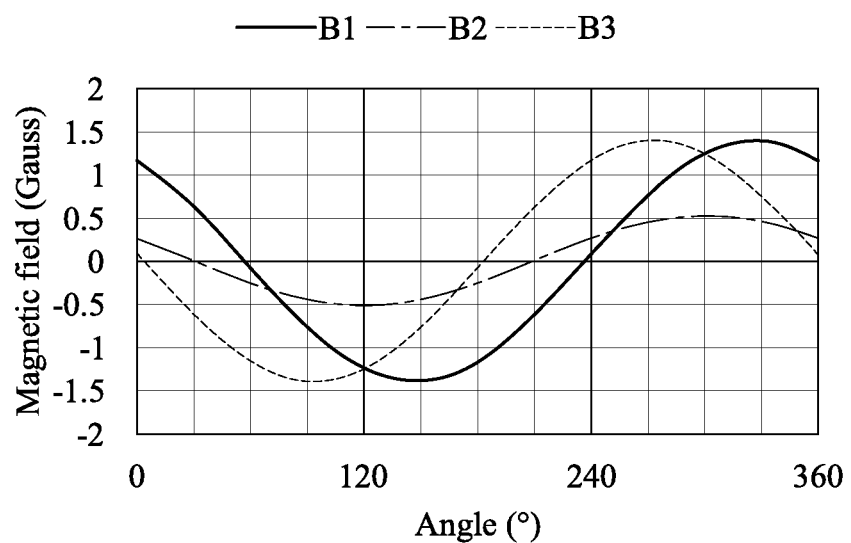
FIG. 7 is a magnetic field waveform diagram of a current detection method according to an embodiment of this disclosure.
Figure 8:
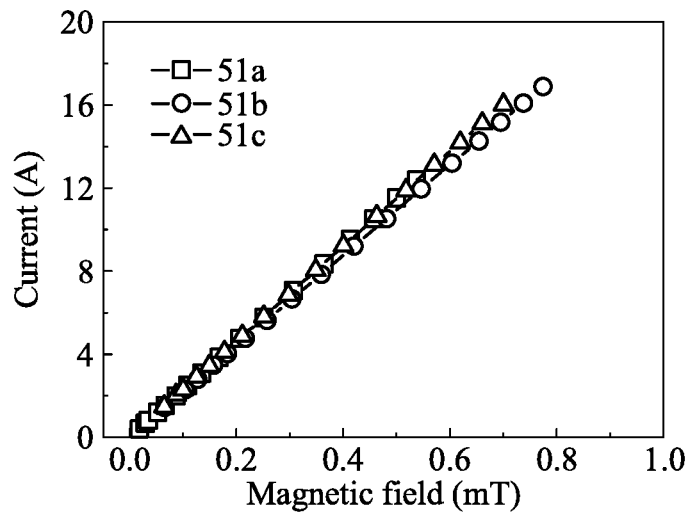
FIG. 8 is a detection result diagram of a current detection method according to an embodiment of this disclosure.

Please refer to FIG. 1 and FIG. 5-FIG. 8 for explaining the method by which the current detection device 1 executes current detection, wherein FIG. 5 is a flowchart of a current detection method according to an embodiment of this disclosure; FIG. 6 is a schematic diagram of a current detection method according to an embodiment of this disclosure; FIG. 7 is a magnetic field waveform diagram of a current detection method according to an embodiment of this disclosure; and FIG. 8 is a detection result diagram of a current detection method according to an embodiment of this disclosure.

The current detection method shown in FIG. 5 is exemplified to be performed by the current detection device 1 in FIG. 1. In step S101, the current detection device 1 sets a plurality of magnetic sensors 12 to surround the multi-core conducting wire 5 and to equally share the 360-degree peripheral of the multi-core conducting wire 5. More specifically, the three magnetic sensor 12 of the current detection device 1 are disposed around the multi-core conducting wire 5 at 120 degrees from one another, and the distance between each of the magnetic sensors 12 and the axle center of the multi-core conducting wire (i.e. the center C of the accommodating channel 111) is the same. In step S103, the current detection device 1 measures the alternating magnetic field of the multi-core conducting wire 5 by the plurality of magnetic sensors 12 when the multi-core conducting wire 5 is powered on, so as to generate a plurality of magnetic field measured values, wherein each of the plurality of magnetic field measured values corresponds to one of the plurality of magnetic sensors 12. In other words, each of the magnetic sensors 12 generates a respective one of the magnetic field measured values.

In step S105, the processor 13 calculates the current value of each of the core wires 51a-51c of the multi-core conducting wire 5 according to a current decoupling model and the magnetic field measured values generated by the magnetic sensors 12. Further, the current decoupling model comprises a transfer matrix. When the magnetic field measured value measured by one of the three magnetic sensors 12 matches a preset condition, the processor 13 multiplies the inverse matrix of the transfer matrix and the matrix formed by the magnetic field measured values measured by the magnetic sensors 12 together to calculate the current value of each of the core wires 51a-51c of the multi-core conducting wire 5. More specifically, the building method of the current decoupling model is described as follows.

As shown in FIG. 6, the three core wires 51a, 51b and 51c of the multi-core conducting wire 5 respectively have current values Ia, Ib and Ic when they are powered on. The three magnetic sensors 121, 122 and 123 are configured to measure the alternating magnetic field of the multi-core conducting wire 5 generated when the multi-core conducting wire 5 is powered on, so as to respectively generate the magnetic field measured values B1, B2 and B3. Further, the magnetic field measured values B1, B2 and B3 respectively indicate the tangential component of the magnetic field at the positions of the magnetic sensors 121, 122 and 123. When the position of the magnetic sensor 121, the axle center of the core wire 51a and the axle center O of the multi-core conducting wire 5 are collinear, the magnetic field measured value B1 measured by the magnetic sensor 121 comprises magnetic influence parameters B1a, B1b and B1c, wherein the magnetic influence parameter B1a corresponds to the magnetic field generated by the core wire 51a; the magnetic influence parameter B1b corresponds to the magnetic field generated by the core wire 51b; and the magnetic influence parameter B1c corresponds to the magnetic field generated by the core wire 51c. The formulas for calculating the magnetic influence parameters B1a, B1b and B1c are as follows:

$$B1a = \frac{2Ia}{r - r1};$$

$$B1b = \frac{2Ib}{h}\cos \alpha;$$

$$B1c = \frac{2Ic}{h}\cos \alpha.$$

Therefore, when the current values Ia, Ib and Ic are used to express the magnetic field measured value B1 measured by the magnetic sensor 121, it can be obtained that:

$$B1 = B1a + B1b + B1c = A1Ia + A2Ib + A2Ic;$$

$$A1 = \frac{2}{r - r1};$$

$$A2 = \frac{2}{h}\cos \alpha = \frac{2r + r1}{r^2 + r \cdot r1 + r1^2},$$

wherein r indicates the distance between the magnetic sensor 121 and the axle center O of the multi-core conducting wire 5; r1 indicates the distance between the axle center O of the multi-core conducting wire 5 and the core wire 51a, 51b or 51c; h indicates the distance between the magnetic sensor 121 and the core wire 51b or 51c; α indicates the included angle between the extension direction of r and the extension direction of h. In the above formulas, the length unit is millimeter (mm), the current unit is ampere (A), and the magnetic field unit is gauss. Similarly, the magnetic field measured value B2 measured by the magnetic sensor 122 and the magnetic field measured value B3 measured by the magnetic sensor 123 can be obtained as follows:

$$B2 = A2Ia + A1Ib + A2Ic;$$

$$B3 = A2Ia + A2Ib + A1Ic.$$

According to the above relationships between the magnetic field measured values B1, B2 and B3 and the current values Ia, Ib and Ic of the core wires 51a, 51b and 51c, a transfer matrix [A] can be constructed as follows:

$$\begin{bmatrix} B1 \\ B2 \\ B3 \end{bmatrix} = [A] \begin{bmatrix} Ia \\ Ib \\ Ic \end{bmatrix}, [A] = \begin{bmatrix} A1 & A2 & A2 \\ A2 & A1 & A2 \\ A2 & A2 & A1 \end{bmatrix},$$

Through multiplying the inverse matrix of the transfer matrix [A] and the matrix formed by the magnetic field measured values B1, B2 and B3 together, the current values Ia, Ib and Ic of the core wires 51a, 51b and 51c can be calculated as follows:

$$\begin{bmatrix} Ia \\ Ib \\ Ic \end{bmatrix} = [A^{-1}] \begin{bmatrix} B1 \\ B2 \\ B3 \end{bmatrix} = \begin{bmatrix} A3B1 + A4(B2 + B3) \\ A3B2 + A4(B1 + B3) \\ A3B3 + A4(B1 + B2) \end{bmatrix};$$

$$A3 = \frac{1}{|A|}(A1^2 - A2^2);$$

$$A4 = \frac{1}{|A|}(A2^2 - A1A2);$$

$$|A| = A1^3 + 2A2^3 - 3A1A2^2.$$

In an embodiment, the magnetic field measured value B1, B2 and B3 respectively measured by the magnetic sensors 121, 122 and 123 are illustrated in FIG. 7, wherein the waveform of the magnetic field measured value B2 is different from the waveforms of the magnetic field measured values B1 and B3; that is, the electricity of the core wires 51a, 51b and 51c of the multi-core conducting wire 5 is unbalanced (i.e. one of the current values Ia, Ib and Ic is different from the other two current values). Through the aforementioned calculation of the current decoupling model, the waveforms of the magnetic field measured values B1, B2 and B3 respectively measured by the magnetic sensors 121, 122 and 123 can be converted into the waveforms of the current values Ia, Ib and Ic of the core wires 51a, 51b and 51c, so as to distinguish which core wire is abnormal.

FIG. 8 illustrates the relationship curves respectively between the current values Ia, Ib and Ic of the core wires 51a, 51b and 51c calculated by the processor 13 and the magnetic fields of the core wires 51a, 51b and 51c. As shown in FIG. 8, with the same electric power, the maximum current value (the amplitude of the current waveform) of the core wire 51a is less than the maximum current values of the core wires 51b and 51c. In other words, the core wire 51a must have abnormal conditions. Therefore, through the aforementioned current detection method, the current waveforms of each core wire in the multi-core conducting wire may be analyzed so as to determine whether there is an abnormal core wire.

In the above embodiment, the situation of implementation is explained that the current decoupling model is performed when the position of the magnetic sensor 121, the axle center of the core wire 51a and the axle center O of the multi-core conducting wire 5 are collinear, so as to calculate the current values Ia, Ib and Ic of the core wires 51a, 51b and 51c. In particular, the aforementioned current decoupling model can be performed when the position of any one of the magnetic sensors 121, 122 and 123, the axle center of any one of the core wires 51a, 51b and 51c and the axle center O of the multi-core conducting wire 5 are collinear. For example, when the magnetic sensor 121, the axle center of the core wire 51b and the axle center O of the multi-core conducting wire 5 are collinear, the processor 13 performs the following calculation for calculating the current values Ia, Ib and Ic.

$$\begin{bmatrix} Ia \\ Ib \\ Ic \end{bmatrix} = [A^{-1}] \begin{bmatrix} B1 \\ B2 \\ B3 \end{bmatrix}.$$

Figure 9:
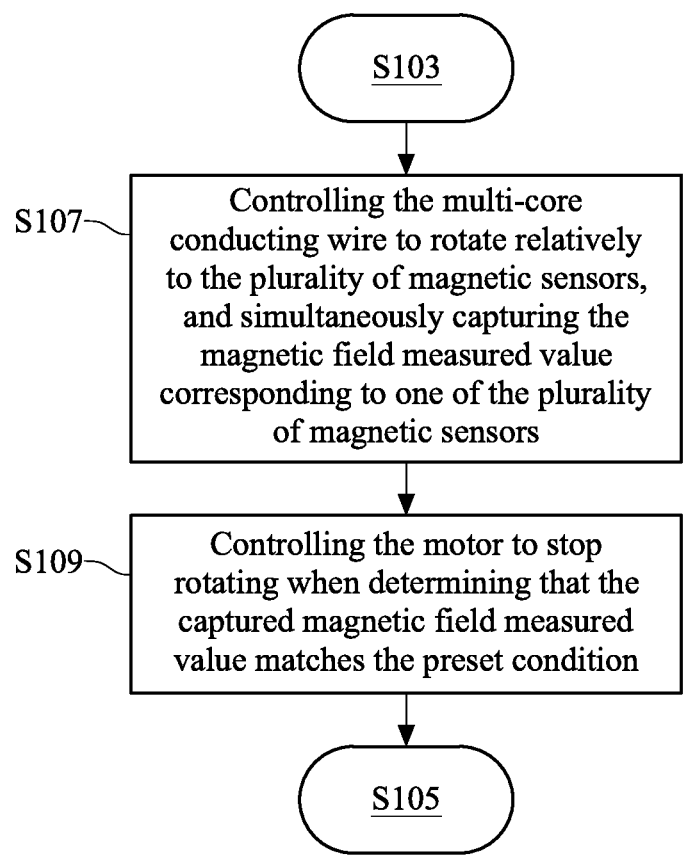
FIG. 9 is a flowchart of a current detection method according to another embodiment of this disclosure.

For another embodiment, please refer to FIG. 2, FIG. 5 and FIG. 9, wherein FIG. 9 is a flowchart of a current detection method according to another embodiment of this disclosure, and steps S107-S109 shown in FIG. 9 can be executed between the steps S103 and S105 in FIG. 5. Taking the current detection method shown in FIG. 9 performed by the current detection device 1' in FIG. 2 as an example, when the position of any one of the magnetic sensors 121, 122 and 123 of the current detection device 1' is not collinear with the axle center of any one of the core wires 51a, 51b and 51c and the axle center O of the multi-core conducting wire 5, the current detection device 1' can control the multi-core conducting wire 5 to rotate relatively to the magnetic sensors 121, 122 and 123 until the position of any one of the magnetic sensors 121, 122 and 123, the axle center of any one of the core wires 51a, 51b and 51c and the axle center O of the multi-core conducting wire 5 are collinear. More specifically, in step S107, the controller 15 of the current detection device 1' controls the motor 14 to rotate to bring the inner ring component 113 which fixes the multi-core conducting wire 5 to rotate relatively to the outer ring component 115 where the magnetic sensors 121, 122 and 123 are disposed, so as to make the multi-core conducting wire 5 rotate relatively to the magnetic sensors 121, 122 and 123. At the same time, the controller 15 captures one of the magnetic field measured values B1, B2 and B3 which is measured by the magnetic sensor 121, 122 or 123.

For the magnetic sensor 121 as an example, in step S109, when the controller 15 determines that the magnetic field measured value B1 measured by the magnetic sensor 121 matches the preset condition, it controls the motor 14 to stop rotating, and performs the step S105 in FIG. 5 which is the aforementioned step of calculating the current values Ia, Ib and Ic of the core wires 51a, 51b and 51c by the current decoupling model. The preset condition indicates that the magnetic field measured value B1 reaches the maximum magnetic field measured value measured by the magnetic sensor 121 during its rotation relative to the multi-core conducting wire 5. More specifically, the controller 15 can control the inner ring component 113 to rotate relative to the outer ring component 115 by a preset angle at a preset frequency until the angle of relative rotation there Between reaches 120 degrees or 360 degrees, and simultaneously keeps capturing the magnetic field measured values of the magnetic sensors 121, wherein the preset frequency is the current frequency of the core wires 51a, 51b and 51c. In other words, the controller 15 can obtain a plurality of magnetic field measured waveforms corresponding to a plurality of measurement positions (indicating the relative positions between the inner ring component 113 and the outer ring component 115), wherein these measurement positions are spaced by the preset angle from one another relatively to the axle center O of the multi-core conducting wire 5. The controller 15 determines that the magnetic field measured waveform having the maximum peak value among the plurality of magnetic field measured waveforms as the target measurement position, and controls the inner ring component 113 and the outer ring component 115 to relatively rotate until the relative positions therebetween matches the target measurement position.

By the alignment control of the controller 15 and the motor 14, when a user uses the current detection device 1' to measure the multi-core conducting wire 5, it may be unnecessary to consider the position and the angle of the multi-core conducting wire 5 as being inserted in the carrier 21.

Figure 10:
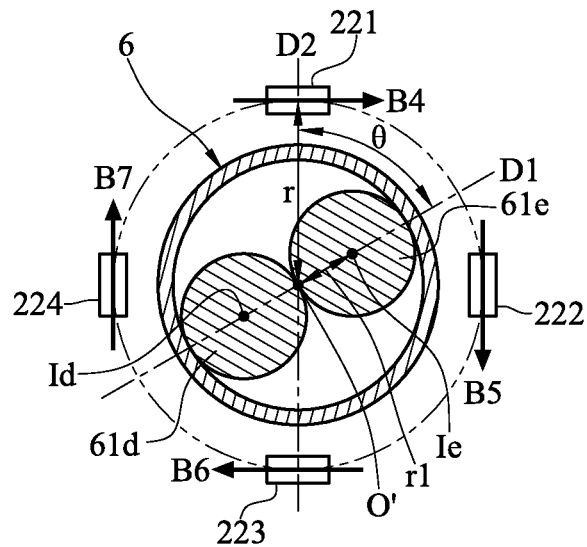
FIG. 10 is a schematic diagram of a current detection method according to yet another embodiment of this disclosure.
Figure 11:
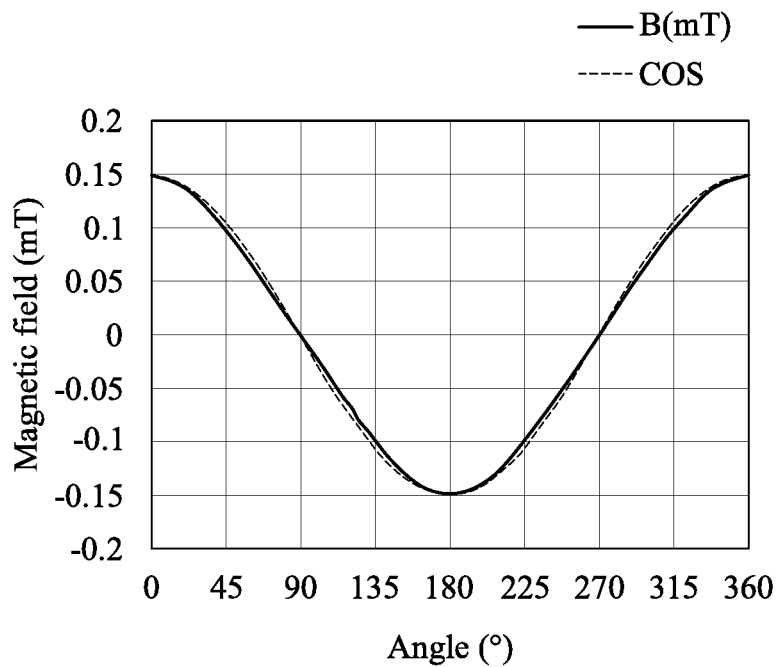
FIG. 11 is a magnetic field waveform diagram of a current detection method according to yet another embodiment of this disclosure.
Figure 12:
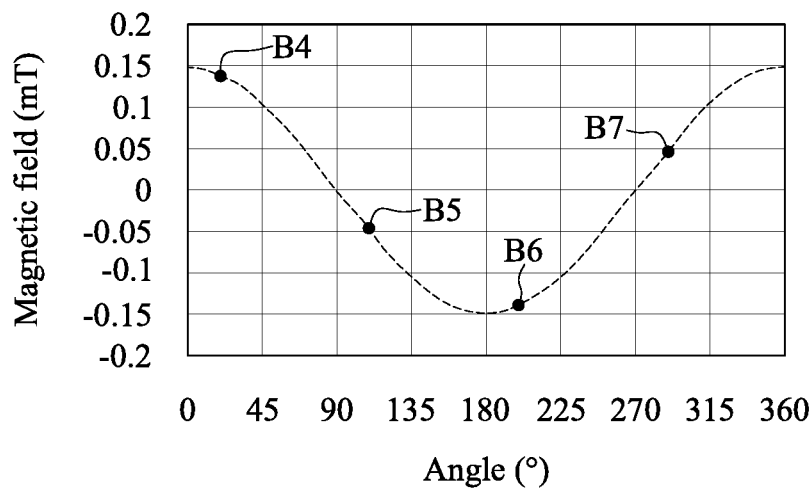
FIG. 12 is a magnetic field waveform diagram of a current detection method according to yet another embodiment of this disclosure.
Figure 13:
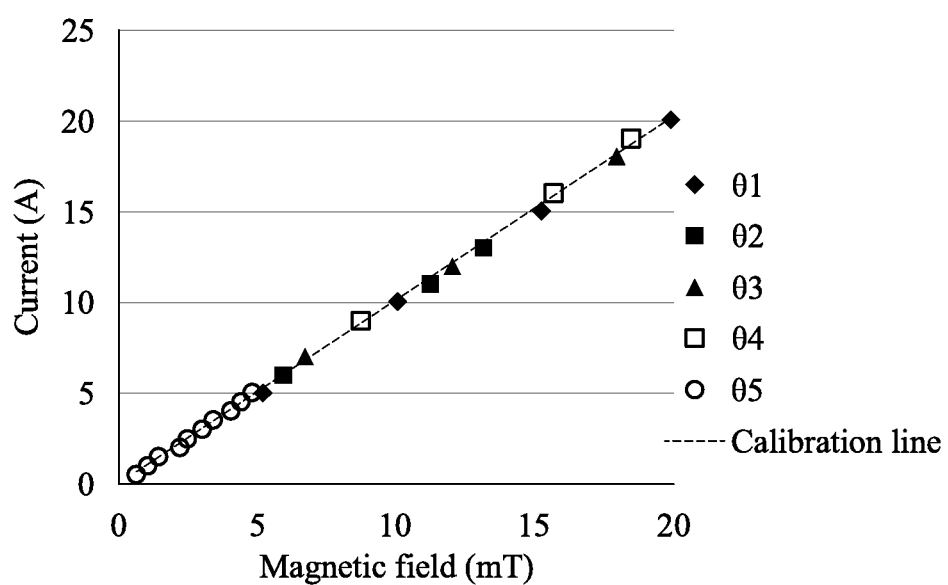
FIG. 13 is a detection result diagram of a current detection method according to yet another embodiment of this disclosure.

Please refer to FIG. 4, FIG. 5, FIG. 10-FIG. 13 for explaining the implementation of the current detection method by the current detection device 2, wherein FIG. 10 is a schematic diagram of a current detection method according to yet another embodiment of this disclosure; FIG. 11 and FIG. 12 are magnetic field waveform diagrams of a current detection method according to yet another embodiment of this disclosure; FIG. 13 is a detection result diagram of a current detection method according to yet another embodiment of this disclosure.

The current detection method shown in FIG. 5 is exemplified to be performed by the current detection device 2 in FIG. 4. In step S101, the current detection device 2 sets a plurality of magnetic sensors 22 to surround the multi-core conducting wire 6 and to equally share the 360-degree peripheral of the multi-core conducting wire 6. More specifically, the four magnetic sensors 22 of the current detection device 2 are disposed around the multi-core conducting wire 6 at 90 degrees from one another, and the distance between each of the magnetic sensors 22 and the axle center of the multi-core conducting wire 6 (i.e. the center C' of the accommodating channel 211) is the same. In step S103, the current detection device 2 measures the alternating magnetic field of the multi-core conducting wire 6 by the plurality of magnetic sensors 22 when the multi-core conducting wire 6 is powered on, so as to generate a plurality of magnetic field measured values, wherein each of the plurality of magnetic field measured values corresponds to one of the plurality of magnetic sensors 22. In other words, each of the magnetic sensors 22 generates a respective one of the magnetic field measured values.

In step S205, the processor 23 calculates the current value of each of the core wires 61d and 61e according to a current decoupling model and the magnetic field measured values generated by the magnetic sensors 22. Further, the current decoupling model comprises a magnetic field conversion equation. The processor 13 substitutes the magnetic field measured values measured by the magnetic sensors 22 into the magnetic field conversion equation so as to calculate the coupling magnetic field of the multi-core conducting wire 6, and then obtains the current value of each of the core wires 61d and 61e by Ampere's circuital law. More specifically, the building method of the current decoupling model is described in the following.

As shown in FIG. 10-FIG. 11, the current decoupling model is built by the magnetic field conversion equation, which is obtained by magnetic field simulation, and Ampere's circuital law. Based on the simulation result of the magnetic field simulation, the tangential component B of the coupling magnetic field, which is along the circumference of the circle considering the axle center O' of the multi-core conducting wire 6 as its circle center and considering the distance r between the position of the magnetic sensor 221, 222, 223 or 224 and the axle center O' as its radius, is distributed as a cosine function COS as shown in FIG. 11, and the relationship between the maximum of the coupling magnetic field Bp of the multi-core conducting wire 6 and the current values Id and Ie of the core wires 61$d$ and 61$e$ in the multi-core conducting wire 6 can be calculated by Ampere's circuital law.

$$B_p = \frac{2Id}{r-r1} + \frac{2Ie}{r+r1},$$

wherein r1 indicates the distance between the axle center O' of the multi-core conducting wire 6 and the axle center of the core wire 61$d$ or 61$e$, which is the radius of the core wire 61$d$ or 61$e$.

In the case where a dual-core conducting wire serves as the multi-core conducting wire 6, there is a 180-degree phase difference between the current value Id of the core wire 61$d$ and the current value Id of the core wire 61$e$, so that there is a relationship formula between the current values Id and Ie and the coupling magnetic field Bp:

$$|Id| = |Ie| = B_p \cdot \frac{r^2 - r1^2}{4r1}.$$

As shown in the above formula, the coupling magnetic field is positive proportional to the current value.

For the detailed explanation of the aforementioned magnetic field simulation, as shown in FIG. 10 and FIG. 12, when there is an included angle θ between the connection direction D1 of the axle centers of the core wires 61$d$ and 61$e$ of the multi-core conducting wire 6 and the connection direction D2 of the position of the magnetic sensor 211 and the axle center O' of the multi-core conducting wire 6 and the multi-core conducting wire 6 is powered on, the magnetic sensors 211, 212, 213 and 214 respectively obtain the magnetic field measured values B4, B5, B6 and B7. Further, the magnetic field measured values B4, B5, B6 and B7 respectively indicate the tangential components of the magnetic fields in the positions of the magnetic sensors 211, 212, 213 and 214, and there is the relationship of sine or cosine function between each of the magnetic field measured values B4, B5, B6 and B7 and the included angle θ. In other words, the magnetic sensor 211 and the magnetic sensor 213 are spaced by 180 degrees, so the magnetic field measured values B4 and B6 of these two are opposite numbers; similarly, the magnetic sensor 212 and the magnetic sensor 214 are also spaced by 180 degrees, so the magnetic field measured values B5 and B7 are opposite numbers. Each of the magnetic field measured values B4, B5, B6 and B7 are obtained as follows:

$B4 = B_p \cos(\theta);$ $B5 = B_p \cos(\theta + 90);$ $B6 = B_p \cos(\theta + 180) = -B1;$ $B7 = B_p \cos(\theta + 270) = -B2.$ According to the above magnetic field measured values B4, B5, B6 and B7 and Pythagorean trigonometric identity, the magnetic field conversion equation of the coupling magnetic field Bp of the multi-core conducting wire 6 can be built:

$$B_p = \sqrt{B_{46}^2 + B_{57}^2}, \text{ wherein } B_{46} = \frac{B4 - B6}{2}; B_{57} = \frac{B5 - B7}{2}.$$

The processor 23 calculates the coupling magnetic field Bp of the multi-core conducting wire 6 by the aforementioned magnetic field conversion equation of the current decoupling model, and then uses Ampere's circuital law to convert the coupling magnetic field Bp into the current value of each of the core wires 61$d$ and 61$e$ of the multi-core conducting wire 6 by the aforementioned relationship formula between the coupling magnetic field and the current value. As above described, the magnetic field conversion equation does not involve the included angle θ between the connection direction D1 of the axle centers of the core wires 61$d$ and 61$e$ of the multi-core conducting wire 6 and the connection direction D2 of the position of the magnetic sensor 211 and the axle center O' of the multi-core conducting wire 6. In other words, when the current detection device 2 performs the current detection method, it is not necessary to limit the insertion position and angle of the multi-core conducting wire 6 to the carrier 21. In the detection result of the current detection method performed by the current detection device 2 as shown in FIG. 13, the relationship curves between the magnetic fields and the current values of the multi-core conducting wire 6 obtained by measuring the same multi-core conducting wire 6 by the current detection device 2 for situations with various insertion angles $\theta_1$-$\theta_5$ are all located on the same calibration line, and it means that no matter which insertion angle is used to perform the detection, the same detection result may be obtained. Moreover, the ratio between the coupling magnetic fields and the current values can also be obtained by building the calibration line.

Figure 14:
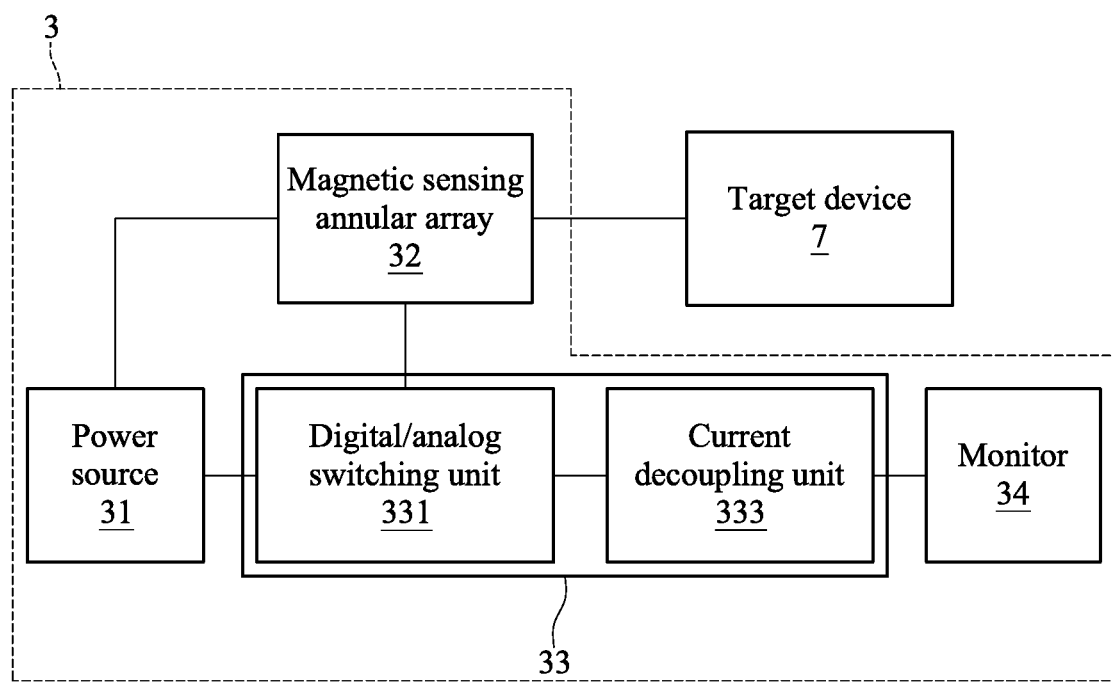
FIG. 14 is a schematic diagram of application of a current detection device according to yet another embodiment of this disclosure.

Please refer to FIG. 14, wherein FIG. 14 is a schematic diagram of application of a current detection device according to yet another embodiment of this disclosure. As shown in FIG. 14, the current detection device 3 comprises a power source 31, a magnetic sensing annular array 32, a processor 33 and a monitor 34, wherein the processor is electrically connected with the power source 31, the magnetic sensing annular array 32 and the monitor 34, and the power source 31 is electrically connected with the magnetic sensing annular array 32. The power source 31 is configured to supply electricity to the other components of the current detection device 3. The magnetic sensing annular array 32, such as the magnetic sensors in the aforementioned embodiments, is configured to measure the magnetic field generated by a multi-core conducting wire (e.g. cable) which is powered on. For example, the target device 7 can be a home appliance with a dual-core conducting wire and applicable to 110-volt voltage, and can also be an industrial facility with a three-core conducting wire and applicable to 220-volt voltage. The processor 33 comprises a digital/analog switching unit 331 and a current decoupling unit 333, wherein the digital/analog switching unit 331 is configured to perform switching so as to capture magnetic field measured values from a plurality of magnetic sensors in the magnetic sensing annular array 32 in turn. The current decoupling unit 333 stores a current decoupling model, and can calculate the current value and the phase of each core wire in the multi-core conducting wire according to the current decoupling model and the magnetic field measured values captured from the magnetic sensing annular array 32. The monitor 34 is configured to show the calculation result of the processor 33 for the user to monitor the electricity transfer state of the target device 7.

In view of the above description, the current detection device and method provided in this disclosure may analyze the current value and the phase of each core wire in the target conducting wire which comprises a plurality of core wires through the annular setting of the magnetic sensors and the calculation of the current decoupling model, without separating each core wire from one another in the target conducting wire, so that the damage to the target conducting wire may be avoided, the detection may be performed in real time during the operation of the facility, and it may be unnecessary to consider the relative positions or angle between the multi-core conducting wire and the carrier.

Although the aforementioned embodiments of this invention have been described above, this invention is not limited thereto. The amendment and the retouch, which do not depart from the spirit and scope of this invention, should fall within the scope of protection of this invention. For the scope of protection defined by this invention, please refer to the attached claims.

SYMBOLIC EXPLANATION 1, 1', 2, 3 current detection device
11, 11', 21 carrier
111, 211 accommodating channel
12, 22, 121-123, 221-223 magnetic sensor
13, 23 processor
5 multi-core conducting wire
51a-51c, 61d, 61e core wire
C, C' center
113 inner ring component
115 outer ring component
14 motor
15 controller
16 flux guiding assembly
R1, R2 radius
Ia-Ie current value
r, r1, h distance
α included angle
B1-B7 magnetic field measured value
B tangential component of magnetic field
COS cosine function
O, O' axle center
D1, D2 connection direction
θ1-θ5 included angle
31 power source
32 magnetic sensing annular array
33 processor
331 digital/analog switching unit
333 current decoupling unit
34 monitor
7 target device
S101-S109 step

What is claimed is:

1. A current detection device applied to a multi-core conducting wire, with the current detection device comprising:
a carrier comprising an accommodating channel for accommodating the multi-core conducting wire, and comprising an inner ring component and an outer ring component, with the inner ring component rotatably disposed within the outer ring component and configured to fix the multi-core conducting wire;
a plurality of magnetic sensors, disposed at the outer ring component of the carrier and surrounding the accommodating channel, and the plurality of magnetic sensors equally sharing a 360-degree peripheral of the accommodating channel, and configured to measure an alternating magnetic field of the multi-core conducting wire when the multi-core conducting wire is powered on so as to generate a plurality of magnetic field measured values respectively, with each of the plurality of magnetic field measured values corresponding to one of the plurality of magnetic sensors;
a processor electrically connected with the plurality of magnetic sensors, storing a current decoupling model, and configured to capture the plurality of magnetic field measured values from the plurality of magnetic sensors, and to calculate a current value of each of core wires of the multi-core conducting wire according to the current decoupling model and the plurality of magnetic field measured values;
a motor connected with the carrier; and
a controller electrically connected with the motor, the plurality of magnetic sensors and the processor, and configured to control the motor to rotate for bringing the inner ring component of the carrier to rotate relatively to the outer ring component and making the multi-core conducting wire rotate relatively to the plurality of magnetic sensors.

2. The current detection device according to claim 1, wherein the multi-core conducting wire is a three-core conducting wire, a quantity of the plurality of magnetic sensors is three, and the processor executes calculating the current value of each of the core wires of the multi-core conducting wire according to the current decoupling model and the plurality of magnetic field measured values when the magnetic field measured value of one of the plurality of magnetic sensors matches a preset condition.

3. The current detection device according to claim 2, wherein the current decoupling model comprises a transfer matrix, the processor multiplies an inverse matrix of the transfer matrix and a matrix formed by the plurality of magnetic field measured values together to calculate the current value of each of the core wires.

4. The current detection device according to claim 2, wherein the controller is configured to control the motor to rotate and simultaneously capture said magnetic field measured value corresponding to said one of the plurality of magnetic sensors, and to control the motor to stop rotating and to instruct the processor to execute calculating the current value of each of the core wires of the multi-core conducting wire according to the current decoupling model and the plurality of magnetic field measured value when determining that the captured magnetic field measured value matches the preset condition.

5. The current detection device according to claim 4, wherein the preset condition indicates a maximum magnetic field measured value of said one of the plurality of magnetic sensors during relative rotation between the three-core conducting wire and the plurality of magnetic sensors when the three-core conducting wire is powered on.

6. The current detection device according to claim 1, wherein the multi-core conducting wire is a dual-core conducting wire, and a quantity of the plurality of magnetic sensors is four.

7. The current detection device according to claim 6, wherein the current decoupling model comprises a magnetic field conversion equation, and the processor calculates a coupling magnetic field of the dual-core conducting wire according to the magnetic field conversion equation and the plurality of magnetic field measured values.

8. The current detection device according to claim 1, further comprising a flux guiding assembly disposed at the carrier and continuously or intermittently surrounding the accommodating channel, wherein a distance between the flux guiding assembly and the accommodating channel is larger than or equal to a distance between the plurality of magnetic sensors and the accommodating channel, and the flux guiding assembly is configured to collect magnetic flux of the alternating magnetic field when the multi-core conducting wire is powered on.

9. A current detection method applied to a multi-core conducting wire, with the current detection method comprising:
  setting a plurality of magnetic sensors to surround the multi-core conducting wire, and to equally share a 360-degree peripheral of the multi-core conducting wire;
  measuring an alternating magnetic field of the multi-core conducting wire by the plurality of magnetic sensors when the multi-core conducting wire is powered on, so as to generate a plurality of magnetic field measured values; and
  calculating a current value of each of core wires of the multi-core conducting wire according to a current decoupling model and the plurality of magnetic field measured values;
  wherein each of the plurality of magnetic field measured values corresponds to one of the plurality of magnetic sensors;
  wherein the multi-core conducting wire is a three-core conducting wire, a quantity of the plurality of magnetic sensors is three, the current decoupling model comprises a transfer matrix, and calculating the current value of each of the core wires of the multi-core conducting wire according to the current decoupling model and the plurality of magnetic field measured value comprises multiplying an inverse matrix of the transfer matrix and a matrix formed by the plurality of magnetic field measured values together to calculate the current value of each of the core wires, and is performed when the magnetic field measured value of said one of the plurality of magnetic sensors matches a preset conditions;
  wherein the plurality of magnetic field measured values respectively indicate magnetic field tangential components at positions of the plurality of magnetic sensors.

10. The current detection method according to claim 9, further comprising:
  controlling the multi-core conducting wire to rotate relatively to the plurality of magnetic sensors, and simultaneously capturing the magnetic field measured value corresponding to said one of the plurality of magnetic sensors; and
  controlling the multi-core conducting wire to stop rotating relatively to the plurality of magnetic sensors when determining that the magnetic field measured value corresponding to said one of the plurality of magnetic sensors matches the preset condition.

11. The current detection method according to claim 10, wherein the preset condition indicates a maximum magnetic field measured value of said one of the plurality of magnetic sensors during relative rotation between the three-core conducting wire and the plurality of magnetic sensors when the three-core conducting wire is powered on.

12. A current detection method applied to a multi-core conducting wire, with the current detection method comprising:
  setting a plurality of magnetic sensors to surround the multi-core conducting wire, and to equally share a 360-degree peripheral of the multi-core conducting wire;
  measuring an alternating magnetic field of the multi-core conducting wire by the plurality of magnetic sensors when the multi-core conducting wire is powered on, so as to generate a plurality of magnetic field measured values; and
  calculating a current value of each of core wires of the multi-core conducting wire according to a current decoupling model and the plurality of magnetic field measured values;
  wherein each of the plurality of magnetic field measured values corresponds to one of the plurality of magnetic sensors;
  wherein the multi-core conducting wire is a dual-core conducting wire, a quantity of the plurality of magnetic sensors is four, the current decoupling model comprises a magnetic field conversion equation, and calculating the current value of each of the core wires of the multi-core conducting wire according to the current decoupling model and the plurality of magnetic field measured value comprises building the magnetic field conversion equation according to the plurality of magnetic field measured values and Pythagorean trigonometric identity, and calculating a coupling magnetic field of the dual-core conducting wire according to the magnetic field conversion equation and the plurality of magnetic field measured values;
  wherein the plurality of magnetic field measured values respectively indicate magnetic field tangential components at positions of the plurality of magnetic sensors.

\* \* \* \* \*